US007010392B2

(12) United States Patent
Bash et al.

(10) Patent No.: US 7,010,392 B2
(45) Date of Patent: Mar. 7, 2006

(54) ENERGY EFFICIENT CRAC UNIT OPERATION USING HEAT TRANSFER LEVELS

(75) Inventors: Cullen E. Bash, San Francisco, CA (US); Ratnesh K. Sharma, Union City, CA (US); Abdlmonem Beitelmal, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/853,522

(22) Filed: May 26, 2004

(65) Prior Publication Data

US 2005/0278069 A1 Dec. 15, 2005

(51) Int. Cl.
*G05D 23/00* (2006.01)

(52) U.S. Cl. ......................... 700/276; 700/300; 62/177

(58) Field of Classification Search ................ 700/276, 700/291, 293, 299, 300; 62/173, 177, 180; 454/239; 705/400
See application file for complete search history.

(56) References Cited

U.S. PATENT DOCUMENTS

| | | | | |
|---|---|---|---|---|
| 5,390,505 | A * | 2/1995 | Smith et al. | 62/173 |
| 5,538,471 | A * | 7/1996 | Guiles, Jr. | 454/239 |
| 6,732,540 | B1 * | 5/2004 | Sugihara et al. | 62/177 |
| 2004/0141542 | A1 | 7/2004 | Sharma et al. | |
| 2005/0023363 | A1 | 2/2005 | Sharma et al. | |

FOREIGN PATENT DOCUMENTS

| | | |
|---|---|---|
| JP | 01219434 | 9/1989 |

* cited by examiner

*Primary Examiner*—Jayprakash N. Gandhi
*Assistant Examiner*—Charles Kasenge
(74) *Attorney, Agent, or Firm*—Richard P. Lange

(57) ABSTRACT

A method for controlling one or more computer room air conditioning (CRAC) units for energy efficient operation, in which, the temperature of the air returned (Trat) into the one or more CRAC units and the temperature of the air supplied (Tsat) by the one or more CRAC units is detected. The caloric heat transfer level (Q) is calculated based upon the Trat and the Tsat and it is determined whether the Q is within a predetermined setpoint caloric heat transfer range. In addition, at least one operation of the one or more CRAC units is reduced in response to the Q being within the predetermined setpoint caloric heat transfer range to thereby increase the efficiencies of the one or more CRAC units.

25 Claims, 7 Drawing Sheets

ENERGY EFFICIENT CRAC UNIT OPERATION USING HEAT TRANSFER LEVELS

BACKGROUND OF THE INVENTION

A data center may be defined as a location, for instance, a room, that houses computer systems arranged in a number of racks. A standard rack, for example, an electronics cabinet, is defined as an Electronics Industry Association (EIA) enclosure, 78 in. (2 meters) high, 24 in. (0.61 meter) wide and 30 in. (0.76 meter) deep. These racks are configured to house a number of computer systems, about forty (40) systems, with future configurations of racks being designed to accommodate 200 or more systems. The computer systems typically include a number of printed circuit boards (PCBs), mass storage devices, power supplies, processors, micro-controllers, and semi-conductor devices, that dissipate relatively significant amounts of heat during their operation. For example, a typical computer system comprising multiple microprocessors dissipates approximately 250 W of power. Thus, a rack containing forty (40) computer systems of this type dissipates approximately 10 KW of power.

The power required to transfer the heat dissipated by the components in the racks to the cool air contained in the data center is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling air across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of the racks.

Conventional data centers are typically cooled by operation of one or more computer room air conditioning (CRAC) units. For example, compressors of CRAC units typically consume a minimum of about thirty (30) percent of the required operating energy to sufficiently cool the data centers. The other components, for example, condensers and air movers (fans), typically consume an additional twenty (20) percent of the required total operating energy. As an example, a high density data center with 100 racks, each rack having a maximum power dissipation of 10 KW, generally requires 1 MW of cooling capacity. CRAC units with a capacity of 1 MW of heat removal generally requires a minimum of 300 KW input compressor power in addition to the power needed to drive the air moving devices, for instance, fans and blowers. Conventional data center CRAC units do not vary their cooling fluid output based on the distributed needs of the data center. Instead, these CRAC units generally operate at or near a maximum compressor power level even when the heat load is reduced inside the data center.

The substantially continuous operation of the CRAC units is generally designed to operate according to a worst-case scenario. For example, CRAC units are typically designed around the maximum capacity and redundancies are utilized so that the data center may remain on-line on a substantially continual basis. However, the computer systems in the data center may only utilize around 30–50% of the maximum cooling capacity. In this respect, conventional cooling systems often attempt to cool components that may not be operating at a level which may cause their temperatures to exceed a predetermined temperature range. Consequently, many conventional cooling systems often incur greater amounts of operating expenses than may be necessary to sufficiently cool the heat generating components contained in the racks of data centers.

Other types of conventional CRAC units are configured to vary the temperature of the cooling fluid as well as the volume flow rate of the cooling fluid supplied into the data center. These types of CRAC units often include cooling systems configured to vary the temperature of the received cooling fluid prior to delivery into the data center. The cooling systems include variable capacity compressors and chilled water systems. In addition, these CRAC units also include blowers with variable frequency drives configured to vary the volume flow rate of the cooling fluid delivered into the data center.

The temperatures to which the cooling systems cool the cooling fluid received from the data center are often based upon the detected temperature of the cooling fluid returned into the CRAC units. In addition, the speeds of the blowers are often correlated to the operations of the cooling systems. In this respect, as the cooling systems are operated to reduce the temperature of the cooling fluid, the blowers are also operated to increase the volume flow rate of the cooled cooling fluid. Operating the cooling systems in this manner is inefficient as both the reduction in cooling fluid temperature and increase in the cooling fluid volume flow rate are typically unnecessary to maintain the components in the data center within predetermined temperature ranges.

A method for controlling one or more computer room air conditioning (CRAC) units for energy efficient operation is disclosed. In the method, the temperature of the air returned (Trat) into the one or more CRAC units and the temperature of the air supplied (Tsat) by the one or more CRAC units is detected. The caloric heat transfer level (Q) is calculated based upon the Trat and the Tsat and it is determined whether the Q is within a predetermined setpoint caloric heat transfer range. In addition, at least one operation of the one or more CRAC units is reduced in response to the Q being within the predetermined setpoint caloric heat transfer range to thereby increase the efficiencies of the one or more CRAC units.

BRIEF DESCRIPTION OF THE DRAWINGS

Features of the present invention will become apparent to those skilled in the art from the following description with reference to the figures, in which.

DETAILED DESCRIPTION OF THE INVENTION

Figure 1A:
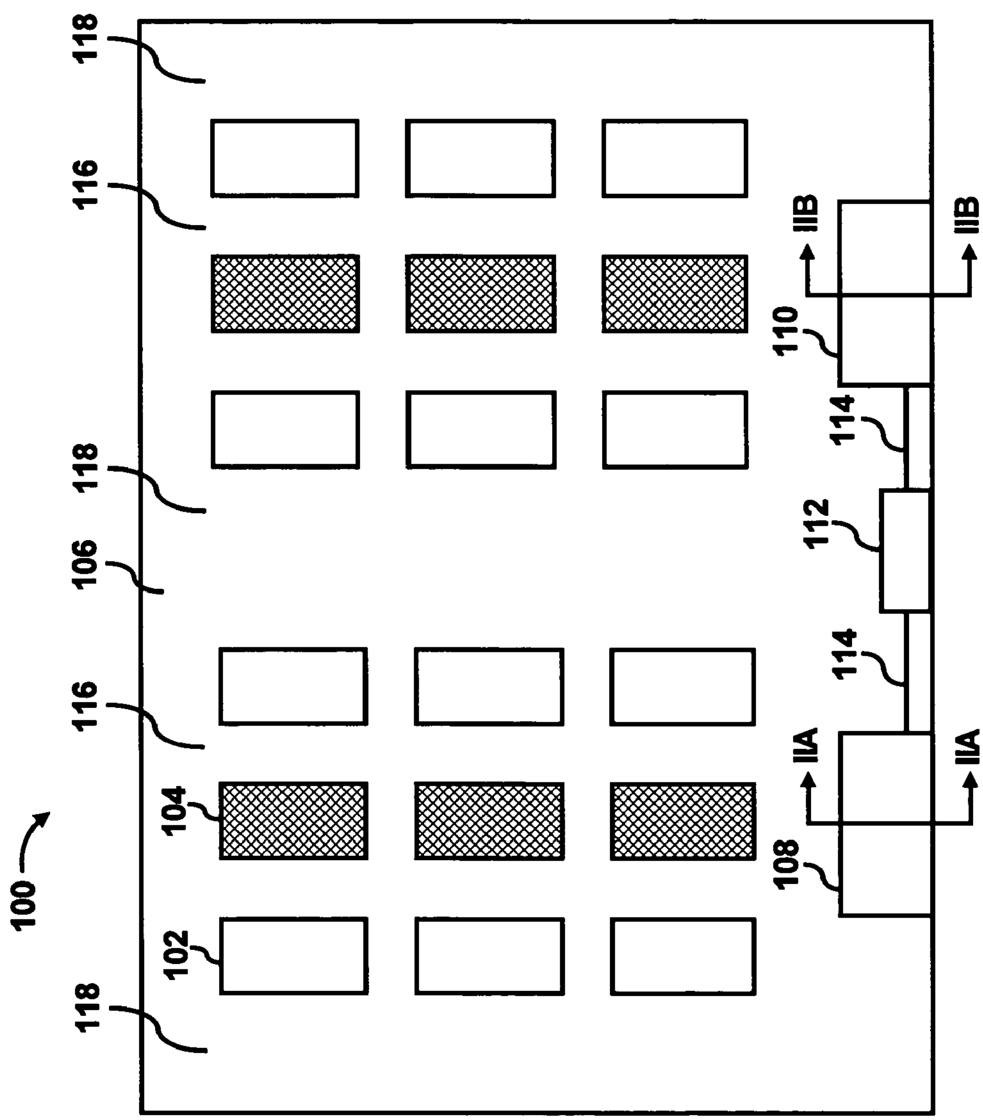
FIG. 1A shows a simplified plan view of a data center, according to an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Throughout the present disclosure, reference is made to "cooling fluid" and "heated cooling fluid". For purposes of simplicity, "cooling fluid" may generally be defined as air that has been cooled by a cooling device, e.g., an air conditioning unit. In addition, "heated cooling fluid" may generally be defined as cooling fluid that has been heated. It should be readily apparent, however, that the terms "cooling fluid" are not intended to denote air that only contains cooled fluid and that "heated cooling fluid" only contains cooling fluid that has been heated. Instead, embodiments of the invention may operate with air that contains a mixture of heated cooling fluid and cooling fluid. In addition, cooling fluid and heated cooling fluid may denote gases other than air, e.g., refrigerant and other types of gases known to those of ordinary skill in the art that may be used to cool electronic components.

According to an example, computer room air conditioning (CRAC) units include systems to enable energy efficient cooling and supply of cooling fluid to a data center. In addition, the systems of the CRAC units are operated in manners to generally optimize the costs associated with cooling components contained in the data center. The CRAC units may thus comprise variably controllable systems designed and operated to cool the components under substantially optimized cost structures.

In one example, the variably controllable systems include chilled fluid systems having a two-way or a three-way valve for variably controlling the flow of chilled fluid, for instance, water, refrigerant, or other coolant, etc., through a cooling coil. In another example, the variably controllable systems include variable capacity compressors designed to variably control cooling of a refrigerant configured to absorb heat from the cooling fluid received from the data center. In either of the examples above, the variably controllable systems include blowers with variable frequency drives configured to control the outputs of the cooling fluid cooled through heat transfer with the fluid contained in the cooling coil.

The variably controllable systems may be operated in manners to generally optimize their energy utilization while maintaining thermal management requirements of the components in the data centers. In one respect, the variably controllable systems may be operated in substantially independent manners to enable the substantial optimization of energy utilization. For instance, the variably controllable systems may be operated to decrease output of cooled cooling fluid in response to a decrease in the temperature of the cooled cooling fluid. In addition, the variably controllable systems may be operated to increase output of cooled cooling fluid in response to an increase in the temperature of the cooled cooling fluid. As the energy requirements of the variably controllable systems may be minimized through these operations, the costs associated with maintaining the components within the bounds of thermal management concerns may also be substantially minimized.

With reference first to FIG. 1A, there is shown a simplified plan view of a data center 100, according to an embodiment of the invention. The terms "data center" are generally meant to denote a room or other space and are not meant to limit the invention to any specific type of room where data is communicated or processed, nor should it be construed that use of the terms "data center" limits the invention in any respect other than its definition hereinabove.

As shown in the FIG. 1A, the data center 100 includes a plurality of racks 102, for instance, electronics cabinets, generally positioned in substantially parallel rows. The racks 102 each house one or more components (not shown). These components may include, for instance, computers, servers, monitors, hard drives, disk drives, etc., designed to perform various operations. Some operations of the components may include, for instance, computing, switching, routing, displaying, etc. These components may comprise subsystems (not shown), for example, processors, micro-controllers, high-speed video cards, memories, semi-conductor devices, and the like to perform these functions. In the performance of these electronic functions, the components, and therefore the subsystems, generally dissipate relatively large amounts of heat. Because the racks 102 have been known to include upwards of forty (40) or more subsystems, they may dissipate substantially large amounts of heat. Cooling fluid is therefore supplied to generally flow around and through the components to absorb the dissipated heat through convection, to maintain the subsystems and the components generally within predetermined operating temperature ranges.

The cooling fluid is illustrated as being supplied through vent tiles 104 in the floor 106 of the data center 100. As will be seen in FIGS. 1B–1D, the floor 106 is a raised floor with a space therebelow. The space generally enables power lines, communication lines, and other wires (not shown), to be located below the floor 106 such that the wires and communication lines are substantially positioned away from an upper surface of the floor 106. The space may also function as a plenum for delivery of cooling fluid from computer room air conditioner (CRAC) units 108 and 110 to the racks 102. The vent tiles 104 are illustrated as being positioned between pairs of adjacent rows of racks 102.

Figure 1D:
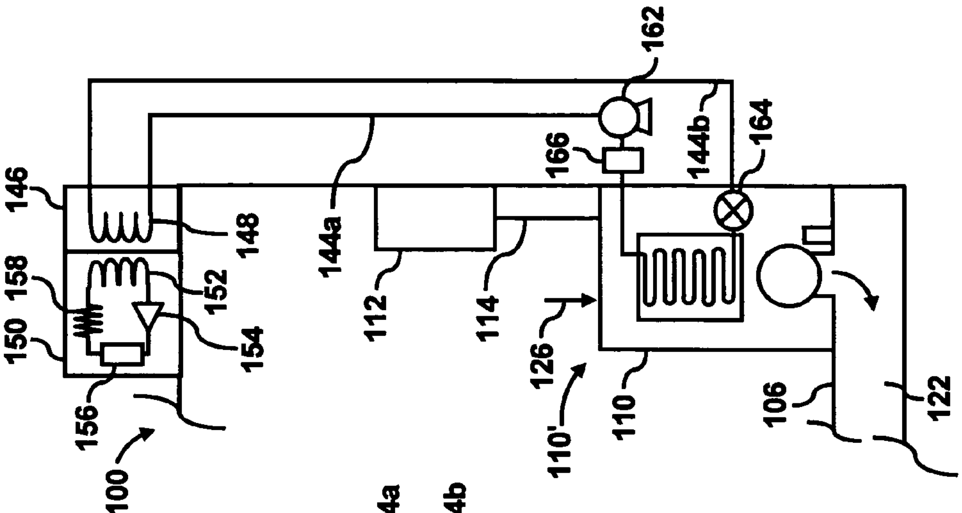
FIG. 1D shows a cross-sectional side view taken along lines IIB—IIB of FIG. 1A, according to a further embodiment.
Figure 1C:
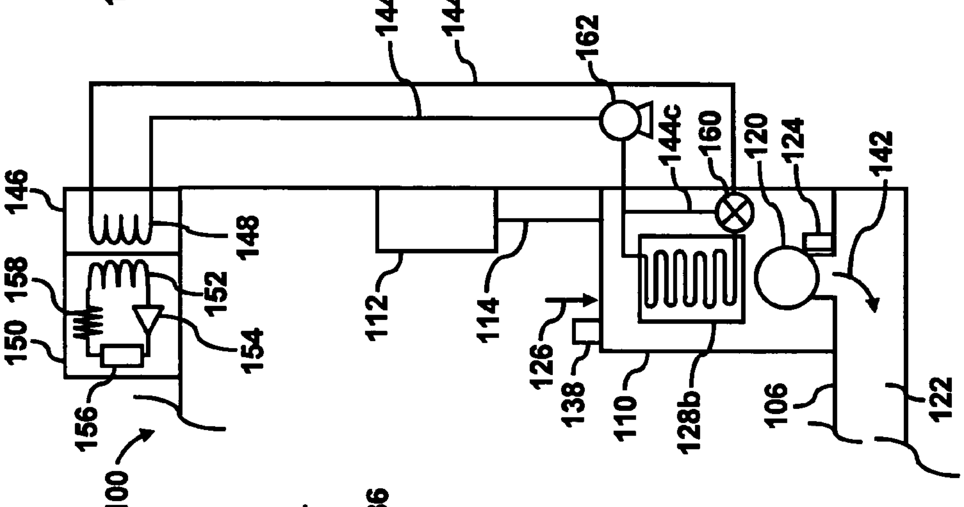
FIG. 1C shows a cross-sectional side view taken along lines IIB—IIB of FIG. 1A, according to another embodiment.
Figure 1B:
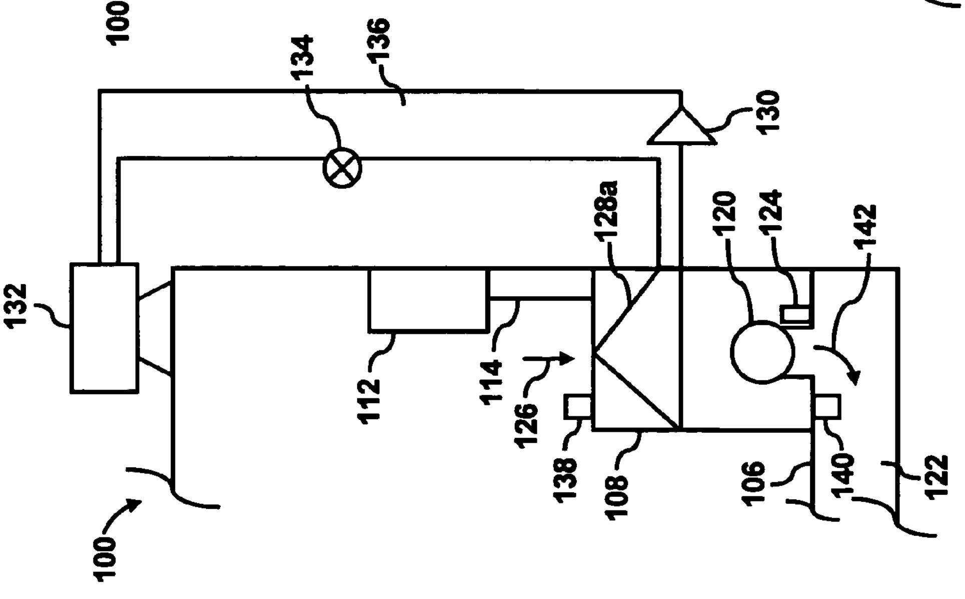
FIG. 1B shows a cross-sectional side view taken along lines IIA—IIA of FIG. 1A, according to an embodiment.

Air or other cooling fluid is received by the CRAC units 108 and 110, cooled through heat transfer within the CRAC units 108 and 110 and supplied into the space below the floor 106. The cooled cooling fluid is supplied from the space below the floor 106, through the vent tiles 104 and through the racks 102 to cool the components housed in the racks 102. The CRAC units 108 and 110 may control various characteristics of the cooling fluid supplied to the racks 102. For instance, the CRAC units 108 and 110 may contain variably controllable systems (not shown) configured to vary the temperature of the cooling fluid supplied to the racks 102. In addition, the CRAC units 108 and 110 may contain systems configured to vary the volume flow rate of the cooling fluid supplied to the racks 102. Various types of systems arranged in various configurations may be employed to control the temperature and volume flow rate of the cooling fluid. Examples of suitable components and configurations are illustrated in FIGS. 1B–1D, which are described in greater detail hereinbelow.

The aisles 116 between the racks 102 having vent tiles 104 located therebetween may be considered as cool aisles 116. These aisles 116 are considered "cool aisles" because they are configured to receive cooling fluid from the vent tiles 104. In addition, the racks 102 are positioned to receive cooling fluid from the cool aisles 116. The aisles 118 between the racks 102 which do not have vent tiles 104 may be considered as hot aisles 118. These aisles are considered "hot aisles" because they are positioned to receive cooling fluid heated by the components in the racks 102.

Also illustrated in FIG. 1A is a computing device 112. The computing device 112 may comprise a computer system, a controller, microprocessor, etc., configured to control operations of the CRAC units 108 and 110. More particularly, the computing device 112 may be configured to receive input from sensors (not shown) and to vary operations of the various variable controllable systems contained in the CRAC units 108 and 110. The computing device 112 may also be configured to receive input from a user, for instance, data center personnel, an administrator, a manager, etc. The input received from a user may comprise various set points by which the computing device 112 may determine how and when to manipulate the operations of the variable controllable systems. The computing device 112 may, in one instance, compare the conditions, for example, temperature, humidity, pressure, etc., detected by the sensors with predetermined set points for those conditions and control the variably controllable systems in response to differences between the set points and the detected conditions.

The computing device 112 is illustrated as communicating with the CRAC units 108 and 110 via wired communication lines 114. However, it should be understood that communications between the CRAC units 108 and 110 and the computing device 112 may be effectuated through a wireless protocol, such as IEEE 802.11b, 802.11g, wireless serial connection, Bluetooth, etc., or combinations thereof, without departing from a scope of the invention. In addition, although a single computing device 112 is illustrated as controlling both CRAC units 108 and 110, each of the CRAC units 108 and 110 may include their own computing device 112. Moreover, the computing device 112 may comprise controllers that are integrally formed or otherwise form part of each of the CRAC units 108 and 110. Thus, although the data center 100 has been illustrated as containing a certain configuration, it should readily be understood that various other configurations are possible for the data center 100 without departing from a scope of the invention.

The data center 100 depicted in FIG. 1A represents a generalized illustration and other components may be added or existing components may be removed or modified without departing from the scope of the invention. For example, the data center 100 may include any number of racks and various other apparatuses known to be housed in data centers. Thus, although the data center 100 is illustrated as containing four rows of racks 102, it should be understood that the data center 100 may include any number of racks, e.g., 100 racks, without departing from the scope of the invention. The depiction of four rows of racks 102 is thus for illustrative and simplicity of description purposes only and is not intended to limit the invention in any respect. In addition, the data center 100 may include any number of CRAC units 108 and 110, each having a number of different types cooling systems.

The data center 100 may also include a lowered ceiling (not shown) configured with returns for receiving heated cooling fluid from within the data center 100. The lowered ceiling may also include or form a plenum for directing the heated cooling fluid to the CRAC units 108 and 110. An example of a data center 100 having a lowered ceiling may be found in co-pending and commonly assigned U.S. patent application Ser. No. 10/262,879, filed on Apr. 17, 2002, the disclosure of which is hereby incorporated by reference in its entirety.

In FIGS. 1B–1D, there are shown simplified partial sections of the data center 100 with three examples of the CRAC units 108, 110, and 110'. FIGS. 1B–1D represent generalized illustrations and other components may be added or existing components may be removed or modified without departing from the scope of the invention. In addition, for instance, although the CRAC units 108 and 110 are illustrated as having different configurations from each other, the CRAC units 108 and 110 employed in the data center 100 illustrated in FIG. 1A may have the same type of configuration without departing from a scope of the invention.

With particular reference first to FIG. 1B, there is shown a cross-sectional side view taken along lines IIA—IIA of FIG. 1A. As shown, the CRAC unit 108 comprises a vapor-compression type air conditioning unit. More particularly, the CRAC unit 108 includes a blower 120 or a fan for delivering air or other cooling fluid into a space 122. The space 122 may be created beneath the raised floor 106 and may include or otherwise function as a plenum. The blower 120 may also operate to draw heated cooling fluid from the data center 100 by generally forcing airflow through the CRAC unit 108. In this regard, the CRAC unit 108 may include one or more openings to receive the heated cooling fluid from the data center 100. A variable frequency drive (VFD) 124 is shown as being positioned adjacent to the blower 120. The VFD 124 generally operates to control the blower 120 to vary the volume flow rate of cooling fluid flow into and out of the CRAC unit 108.

The VFD 124 may comprise any reasonably suitable VFD that is commercially available from any number of manufacturers. The VFD 124 generally operates to variably control the speed of an alternating current (AC) induction motor. More particularly, the VFD 124 may operate to convert power from fixed voltages/fixed frequencies to variable voltages/variable frequencies. By controlling the voltage/frequency levels of the blower 120, the volume flow rate of the cooling fluid supplied by the CRAC unit 108 may also be varied.

Although the VFD 124 is illustrated as being positioned adjacent to the blower 120, the VFD 124 may be positioned at any reasonably suitable location with respect to the blower 120 without departing from a scope of the invention. The VFD 120 may be positioned, for instance, outside of the CRAC unit 108 or various other locations with respect to the CRAC unit 108.

In operation, the heated cooling fluid (shown as the arrow 126) enters into the CRAC unit 108 and is cooled by operation of a cooling coil **128*a*, acompressor 130, acondenser 132, and an expansion valve 134, which may operate under a vapor-compression cycle. By way of example, a refrigerant, for instance, R-134a, etc., may be contained in a refrigerant line 136, which generally forms a loop between the various components of the cooling system containing the CRAC unit 108. More particularly, the refrigerant is supplied into the cooling coil 128***a* where it absorbs heat through convection from the cooling fluid received from the data center 100. The cooled cooling fluid then flows out of the CRAC unit 108 and into the space 122 as indicated by the arrow 142.

The heated refrigerant flows into the compressor 130, which compresses or pressurizes the refrigerant. The compressor 130 may comprise a variable capacity compressor or it may comprise a constant capacity compressor having a hot gas bypass (not shown). In any regard, the pressurized refrigerant then flows into the condenser 132 where some of the heat in the refrigerant is dissipated into the air around the data center 100. Although not shown, the condenser 132 may include a fan to generally enhance heat dissipation of the refrigerant. The refrigerant then flows through the expansion valve 134 and back through the cooling coil 128*a*. This process may be substantially continuously repeated as needed to cool the cooling fluid drawn into the CRAC unit 108. In terms of cooling system efficiency, it is generally desirable that the heated cooling fluid supplied into the CRAC unit 108 is composed of the relatively warmest portion of air in the room 100.

The cooling system illustrated in FIG. 1B has been described in a relatively simplified manner. Therefore, it should be understood that the cooling system incorporating the CRAC unit 108 may include additional components without departing from a scope of the invention. For instance, a three-way valve may be included to allow some of the refrigerant to bypass the compressor 130 and return into the cooling coil 128*a*. The three-way valve may be used, for instance, to divert some of the refrigerant exiting the cooling coil 128*a* back into the refrigerant line 136 for re-entry into the cooling coil 128 to generally ensure that the refrigerant is almost entirely in gaseous form prior to entering the compressor 130.

As described hereinabove, the computing device 112 may be configured to control various operations of the CRAC unit 108. For instance, the computing device 112 may be configured to control the operations of the compressor 130 to thereby control the temperature and flow of the refrigerant flowing through the cooling coil 128*a*. The computing device 112 may also be configured to control the VFD 124. More particularly, the computing device 112 may control the motor speed of a blower 122 to thereby control the volume flow rate of the cooled cooling fluid supplied by the CRAC unit 108. By controlling the temperature of the refrigerant and the airflow rate through the CRAC unit 108, the computing device 112 is generally capable of controlling the level of heat transfer between the heated cooling fluid and the refrigerant to thereby control the temperature of the cooling fluid supplied into the data center 100.

According to an example, the computing device 112 is configured to substantially independently control the compressor 130 and the VFD 124. The computing device 112 may be configured to determine manners in which to control the compressor 130 and the VFD 124 based upon, for instance, environmental condition measurements obtained by sensors 138 and 140. As shown in FIG. 1B, the sensor 138 is positioned at an inlet of the CRAC unit 108 and is thus configured to measure one or more conditions of the cooling fluid returning to the CRAC unit 108.

In addition, the sensor 140 is positioned at an outlet of the CRAC unit 108 and is thus configured to measure one or more conditions of the cooling fluid supplied by the CRAC unit 108. Alternatively, the sensor 140 may be positioned at an inlet of a rack 102 or near a vent tile 104, provided that the rack 102 or the vent tile 104 is located within a relatively close proximity to the exhaust of CRAC unit 108. More particularly, the sensor 140 may be positioned at a location substantially downstream of the CRAC unit 108 where the temperature of the cooling fluid supplied by the CRAC unit 108 does not vary beyond a certain level from the time the cooling fluid exits the CRAC unit 108. In one respect, the computing device 112 may be configured to control the compressor 130 and the VFD 124 to substantially minimize energy usage by the CRAC unit 110 as will described in greater detail hereinbelow.

With reference now to FIG. 1C, there is shown a cross-sectional side view taken along lines IIB—IIB of FIG. 1A. As shown, the CRAC unit 110 comprises a chiller type air conditioning unit. More particularly, the CRAC unit 110 includes a blower 120 or a fan for delivering air or other cooling fluid into a space 122. As described hereinabove with respect to FIG. 1B, the space 122 may be created beneath the raised floor 106 and may include or otherwise function as a plenum. The blower 120 may also operate to draw heated cooling fluid from the data center 100 by generally forcing airflow through the CRAC unit 110. In this regard, the CRAC unit 110 may include one or more openings to receive the heated cooling fluid from the data center 100. A variable frequency drive (VFD) 124 is shown as being positioned adjacent to the blower 120. The VFD 124 generally operates to control the blower 120 to vary the volume flow rate of cooling fluid flow into and out of the CRAC unit 110 as described hereinabove.

The arrow 126 indicates the heated cooling fluid received by the CRAC unit 110. The heated cooling fluid flows past a cooling coil 128*b* and exchanges heat with a coolant contained in the cooling coil 128*b*. The coolant may comprise water or other fluid capable of being heated and cooled in a repeated manner. The speed at which the heated cooling fluid flows past the cooling coil 128*b* and the temperature of the coolant contained in the cooling coil 128*b* generally affect the temperature of the cooling fluid. Thus, for instance, as the temperature of the coolant decreases with the blower 120 operating at a constant level, so too does the temperature of the cooling fluid. The cooled cooling fluid then flows out of the CRAC unit 110 and into the space 122 as indicated by the arrow 142.

The temperature of the coolant contained in the cooling coil 128*b* may be controlled through operation of a cooling system comprising the CRAC unit 110. In operation, the coolant receives heat from the cooling fluid received into the CRAC unit 110. The heat transfer from the cooling fluid into the coolant in the cooling coil 128*b* may be effectuated through convection. The heated coolant then flows out of the cooling coil 128*b* and into a first coolant line 144*a*. The heated coolant flows through the first coolant line 144*a* and into a heat exchanger 146 which may also include a coil 148. The heated coolant is cooled through heat transfer with a refrigeration circuit 150, which includes an evaporator 152, a compressor 154, a condenser 156 and an expansion valve 158. The refrigeration circuit 150 may operate under a vapor-compression cycle generally known to those of ordinary skill in the art.

The cooled coolant returns toward the cooling coil 128*b* through a second coolant line 144*b*. A three-way valve 160 is provided generally upstream from the cooling coil 128*b* along the second coolant line 144*b*. The three-way valve 160 generally operates to control the amount of cooled coolant supplied into the cooling coil 128*b*. The three-way valve 160 may control the cooled coolant delivery into the cooling coil 128*b* by diverting some or all of the cooled coolant back into the first coolant line 144*a* through a third coolant line 144*c*, thereby bypassing the cooling coil 128*b*. The three-way valve 160 may thus substantially control the temperature of the coolant delivered into the cooling coil 128*b* by controlling the amount of cooled coolant delivered into the cooling coil 128*b*. In one respect, therefore, the three-way valve 160 may also control the temperature of the cooling fluid supplied into the space 122.

A pump 162 is illustrated as being located along the first coolant line 144*a*. The pump 162, however, may be positioned along the second coolant line 144*b* without departing from a scope of the invention. The pump 162 generally operates to pressurize the coolant contained in the coolant lines 144*a*–144*c*, such that the coolant may flow along the circuit created by the coolant lines 144*a*–144*c*. The pump 162 may be controlled in addition to or in place of the three-way valve 160 to enable reduced energy usage. In one regard, because the pump 162 may be operated to vary the flow rate of the coolant in the coolant lines 144*a*–144*c*, the pump 162 operations may be reduced, for instance, commensurate with increases in the cooling fluid temperature. In addition, a valve configured to enable a substantially constant and predictable coolant flow in the coolant lines 144*a* and 144*b* may be positioned upstream of the pump 162. The valve may include a spring-loaded valve configured to deliver constant flow for certain pressure ranges. A suitable valve may be available from GRISWOLD CONTROLS of Irvine, Calif.

In operation, the temperature of the coolant contained in the coolant lines 144*a*–144*c* generally dictates the amount of energy consumed in operating the CRAC unit 110. More particularly, the refrigeration circuit 150 generally requires less energy when the temperature of the coolant entering into the heat exchanger 146 is lower. In contrast, the refrigeration circuit 150 generally consumes greater amounts of energy when the temperature of the coolant entering into the heat exchanger 146 is higher. In addition, the desired temperature of the coolant supplied from the heat exchanger 146 also generally dictates the amount of energy consumed by the refrigeration circuit 150. That is, the more work required by the refrigeration circuit 150 in reducing the temperature of the coolant, the greater the energy consumption.

In one example, the refrigeration circuit 150 is operated to cool the coolant to substantially the highest temperature where the three-way valve 160 may remain in a generally fully open position to thus cause substantially all of the coolant to flow into the cooling coil 128*b*. In this regard, the energy consumed by the refrigeration circuit 150 may be substantially minimized as relatively no coolant is diverted away from the cooling coil 128*b*. Moreover, energy consumption of the refrigeration circuit 150 may be lower because the temperature of the refrigerant contained in the refrigeration circuit 150 may be higher and because coolant at higher temperatures generally gains less energy from its surroundings. When multiple CRAC units 110 are employed to cool the components in a data center 100, at least one of the CRAC units 110 may be operated in this manner to thereby reduce energy usage of the at least one of the CRAC units 110.

The computing device 112 is configured to substantially independently control the three-way valve 160 and the VFD 124 to thereby control the temperature of the cooling fluid and the volume flow rate of the supplied cooling fluid. The computing device 112 may be configured to determine manners in which to control the three-way valve 160 and the VFD 124 based upon, for instance, environmental condition measurements obtained by the sensors 138 and 140. In one respect, the computing device 112 may be configured to control the three-way valve 160 and the VFD 124 to substantially minimize energy usage by the CRAC unit 110 as will described in greater detail hereinbelow.

Although reference is made in FIGS. 1B and 1C to the use of a blower 120 to draw heated cooling fluid from the data center 100, it should be understood that any other reasonably suitable manner of cooling fluid removal from the data center 100 may be implemented without departing from the scope of the invention. By way of example, a separate fan or blower (not shown) may be employed to draw heated cooling fluid from the data center 100. In addition, the CRAC units 108 and 110 may include a humidifier and/or a dehumidifier as is known to those of ordinary skill in the art.

In addition, one or more isolation valves (not shown) may be placed at various locations along the coolant lines 144*a*–144*c* to thereby enable, for instance, preventative maintenance.

FIG. 1D depicts a cross-sectional side view taken along lines IIB—IIB of FIG. 1A, according to another example. In FIG. 1D, there is shown a CRAC unit 110'. The CRAC unit 110' includes all of the components illustrated in FIG. 1C and thus specific reference to those components are not reiterated. Instead, only those elements depicted in FIG. 1D, which differ from the components depicted in FIG. 1C are discussed hereinbelow.

The major difference between the CRAC unit 110 and the CRAC unit 110' is that the CRAC unit 110' includes a two-way valve 164 in place of the three-way valve 160. In addition, the CRAC unit 110' does not include the third coolant line 144*c* illustrated in FIG. 1C. The CRAC unit 110' also includes a mass flow sensor 166 positioned along the first coolant line 144*a*. The mass flow sensor 166 is configured to detect the mass flow rate of the fluid flowing through the first coolant line 144*a*. The mass flow sensor 166 may be required in the CRAC unit 110' since the two-way valve 164 does not enable constant coolant flow through the coolant lines 144*a* and 144*b*, as is the case with the three-way valve 160 of the CRAC unit 110. In addition, with use of the two-way valve 164, the valve orifice opening in the two-way valve 164 may require calibration.

The pump 162 may be controlled in addition to or in place of the two-way valve 164 to enable reduced energy usage. In one regard, because the pump 162 may be operated to vary the flow rate of the coolant in the coolant lines 144*a*–144*c*, the pump 162 operations may be reduced, for instance, commensurate with increases in the cooling fluid temperature.

In addition, the temperature of the coolant supplied from the heat exchanger 146 also generally dictates the amount of energy consumed by the refrigeration circuit 150. That is, the more work required by the refrigeration circuit 150 in reducing the temperature of the coolant, the greater the energy consumption. In one example, the refrigeration circuit 150 is operated to cool the coolant to substantially the highest temperature where the two-way valve 164 may remain in a generally fully open position to thus cause substantially all of the coolant to flow into the cooling coil 128*b*. The energy consumed by the refrigeration circuit 150 may be lower because the temperature of the refrigerant contained in the refrigeration circuit 150 may be higher and because coolant at higher temperatures generally gains less energy from its surroundings. When multiple CRAC units 110 are employed to cool the components in a data center 100, at least one of the CRAC units 110 may be operated in this manner to thereby reduce energy usage of the at least one of the CRAC units 110.

Figure 2A:
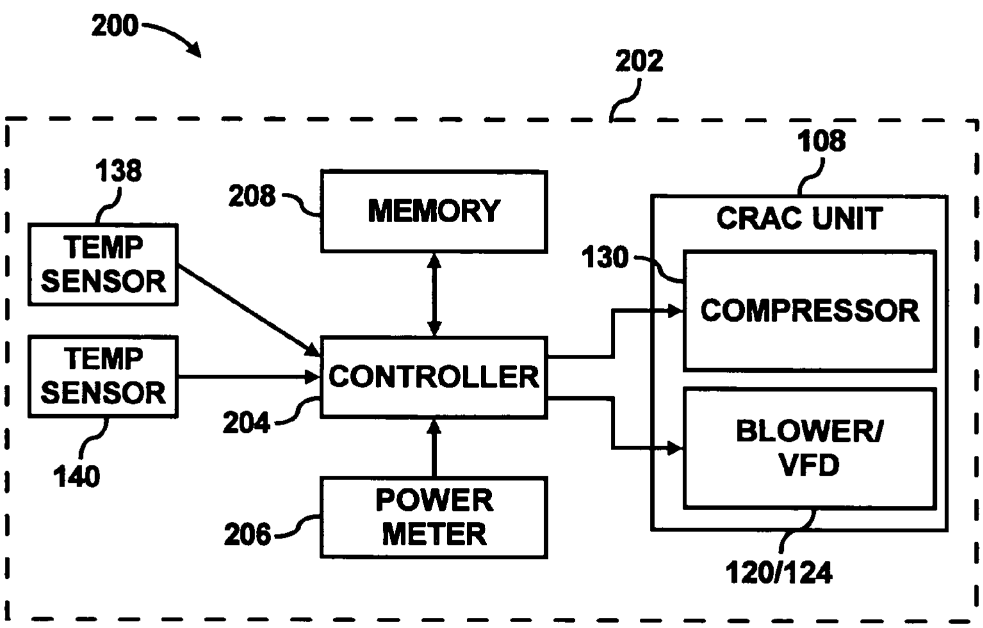
FIGS. 2A–2C are respective block diagrams of CRAC control systems operable to control CRAC units according to various embodiments.
Figure 2B:
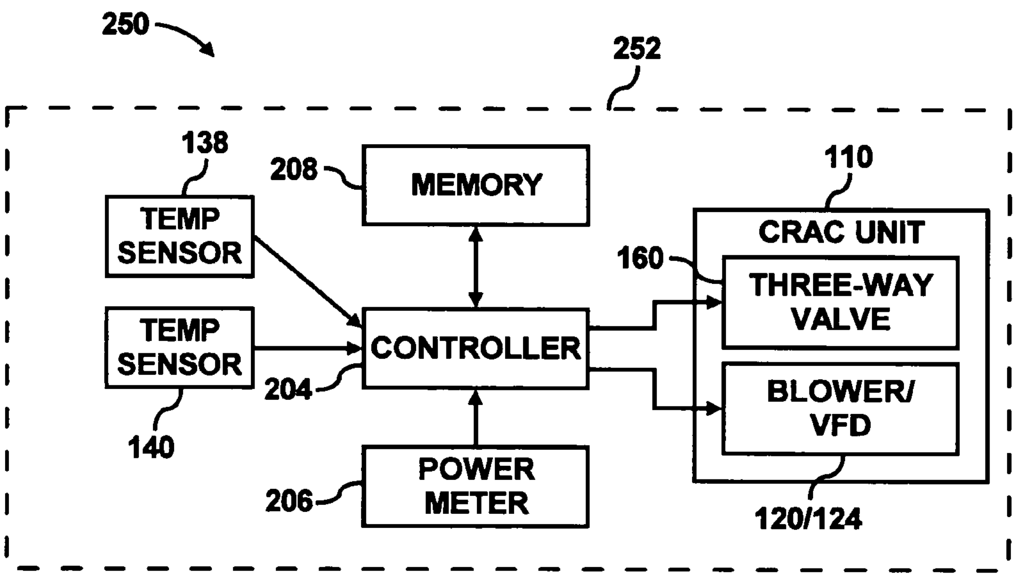
Figure 2C:
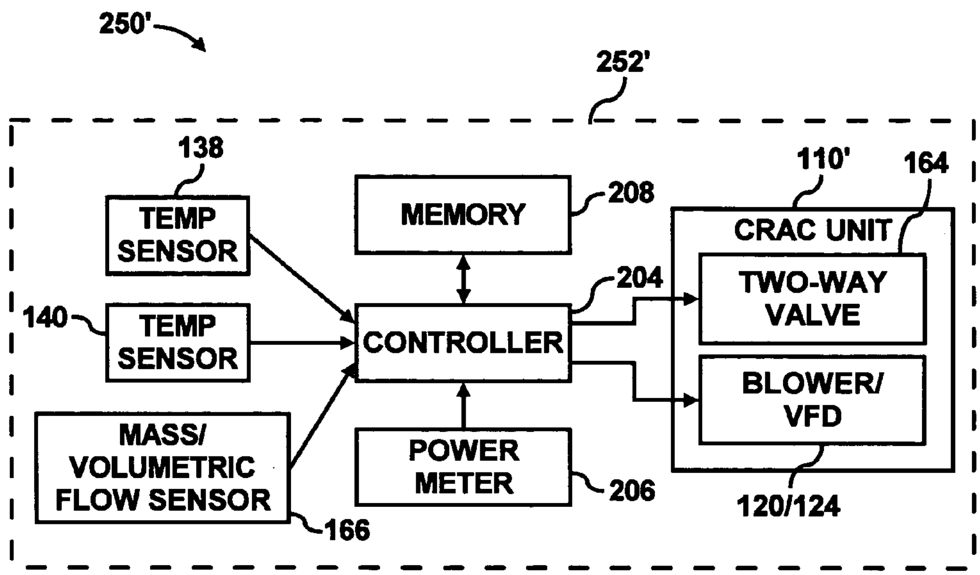

FIGS. 2A–2C are respective block diagrams 200, 250, and 250' of CRAC control systems 202, 252, and 252' operable to control the CRAC units 108, 110 and 110'. The following descriptions of the block diagrams 200, 250, 250' are some manners of a variety of different manners in which such CRAC control systems 202, 252, 252' may be configured. In addition, it should be understood that the block diagrams 200, 250, 250' may include additional components and that some of the components described herein may be removed and/or modified without departing from the scope of the invention.

With reference first to FIG. 2A, the CRAC control system 202 includes a controller 204 for controlling operations of the CRAC control system 202. The controller 204 may comprise the computing device 112 and thus may also comprise a microprocessor, a micro-controller, an application specific integrated circuit (ASIC), and the like. The controller 204 is generally configured to receive temperature measurements from an inlet temperature sensor 138, an outlet temperature sensor 140 and an optional power meter 206.

As described hereinabove, the inlet temperature sensor 138 generally operates to detect the temperature of the heated cooling fluid received by the CRAC unit 108. In addition, the outlet temperature sensor 140 is configured to detect the temperature of the cooled cooling fluid supplied by the CRAC unit 108. In a general sense, the controller 204 may determine manners in which to control the CRAC unit 108 based substantially upon the temperatures detected by the temperature sensors 138 and 140.

Communications between the sensors 138 and 140 and the controller 204 may be effectuated through, for instance, an Ethernet-type connection or through a wired protocol, such as IEEE 802.3, etc., or wireless protocols, such as IEEE 802.11b, 802.11g, wireless serial connection, Bluetooth, etc., or combinations thereof.

The temperature information received from the temperature sensors 138 and 140 may be stored in a memory 208. In addition, various control schemes for operating the CRAC unit 108 may be stored in the memory 208. In this regard, the memory 208 may comprise a traditional memory device, such as, volatile or non-volatile memory, such as DRAM, EEPROM, flash memory, combinations thereof, and the like. The controller 204 may thus access information stored in the memory 208 to determine the manners in which the CRAC unit 108 may be operated.

The optional power meter 206 may detect the power consumption of the CRAC unit 108 and thus may be positioned or otherwise configured to measure the power consumption of the CRAC unit 108. The power meter 206 may comprise any reasonably suitable, and commercially available power meter capable of measuring the CRAC unit 108 power consumption. The controller 204 may receive the detected power consumption and may also store this information in the memory 208. The power meter 206 is considered as being optional because the controller 204 may be configured to calculate the CRAC unit 108 power consumption based upon operations of the various components, for instance, compressor 130, blower 120, etc. As an example, the controller 204 may be configured to determine the power consumption of the compressor 130 based upon its current operating load. A correlation between the power consumption levels and the operating loads of the compressor 130 may be employed to make this determination.

With reference now to FIG. 2B, the CRAC control system 252 includes similar components to those described hereinabove with respect to the CRAC control system 202. Therefore, only those components that differ from the elements described hereinabove with respect to the CRAC control system 202 will be described. More particularly, the CRAC control system 252 includes the CRAC unit 110 instead of the CRAC unit 108. In this regard, the CRAC control system 252 is configured to control the three-way valve 160 to vary the temperature of the cooling fluid supplied to the data center 100.

As an example, the controller 204 may operate to control the three-way valve 160 and the blower 120 in manners to substantially minimize the power consumption of the CRAC unit 110 while maintaining the temperature of the cooling fluid supplied by the CRAC unit 110 within the threshold setpoint temperature range. The controller 204 may thus determine various operating conditions for the three-way valve 160 and the blower 120 to substantially minimize the power consumptions associated with their operations. Although reference is made throughout the present disclosure to the control of the blower 120, the controller 204 may control the VFD 124 to thereby control the blower 120 speed.

As depicted in FIG. 2C, the CRAC control system 252' includes similar components to those described hereinabove with respect to the CRAC control systems 202 and 252. Therefore, only those components that differ from the elements described hereinabove with respect to those CRAC control systems 202 and 252 will be described. As shown, the CRAC control system 252' includes the CRAC unit 110' instead of the CRAC units 108 and 110. In this regard, the CRAC control system 252' is configured to control the two-way valve 164 to vary the temperature of a coolant and therefore vary the temperature of the cooling fluid supplied by the CRAC unit 110'.

In addition, the controller 204 may control the blower 120 to control the volume flow rate of the cooling fluid supplied by the CRAC unit 110'. In this regard, the controller 204 may control the temperature and the volume flow rate of the cooling fluid supplied by the CRAC unit 110' in manners to substantially minimize the power consumption of the CRAC unit 110' while maintaining the temperature of the cooling fluid supplied by the CRAC unit 110 within the threshold setpoint temperature range. The controller 204 may thus determine various operating conditions for the two-way valve 164 and the blower 120 to substantially minimize the power consumptions associated with their operations.

In each of the CRAC control systems 202, 252, 252', the controller 204 may be configured to receive input from a user, for instance, a technician, an administrator, etc. As described in greater detail hereinbelow, the controller 204 may include one or more input devices, for instance, keyboard, mouse, disk drives, etc., for receiving input from the user. The input may, for instance, be in the form of predetermined operating set points for the CRAC units 108, 110, 110'. By way of example, a user may input a setpoint temperature (Tset) range into the controller 204. The setpoint temperature (Tset) range may be based upon desired heat removal characteristics in the data center 100. In one respect, the setpoint temperature (Tset) range may comprise temperatures that ensure safe operating conditions for the components housed in the data center 100. The safe operating conditions for the components may be based upon the specifications provided by the component manufacturers. Alternatively, the safe operating conditions may be determined through testing of the components or through historical data. For instance, the components may be operated at various temperatures to determine at which temperatures the performance characteristics of the components being to decline or when the components begin to fail.

A maximum setpoint temperature (Tset,max) of the setpoint temperature (Tset) range may constitute an upper limit of safe operating conditions for the components. In other words, if the heated cooling fluid returning to the CRAC units 108, 110, 110' is above the maximum setpoint temperature (Tset,max), it may be determined that the temperature of the components may be beyond the safe operating conditions. As another example, a minimum setpoint temperature (Tmin,set) of the setpoint temperature (Tset) range may constitute a lower limit indicating a temperature at which operations of the CRAC units 108, 110, 110' may be ceased. In addition, the controller 204 may store the inputted threshold setpoint temperature (Tset) range in the memory 208.

In addition, the controller 204 may utilize the information received from one or both of the sensors 138, 140, the power meter 206, and the user received input, to determine manners in which to operate the compressor 130, the three-way valve 160, or the two-way valve 164, and the blower 120 of the CRAC unit 108. In one example, the controller 204 may operate the compressor 130, three-way valve 160, or the two-way valve 164, and the blower 120 to substantially minimize power consumption of the respective CRAC units 108, 110, 110' while maintaining the temperature of heated cooling fluid returned to the CRAC units 108, 110, 110' within the setpoint temperature (Tset) range. Thus, for instance, the controller 204 may manipulate the compressor 130, the three-way valve 160, or the two-way valve 164, and the blower 120 operations to various levels so long as the temperature of the heated cooling fluid returned to the CRAC units 108, 110, 110' remains within the setpoint temperature (Tset) range.

As another example, the controller 204 may determine manners in which to operate the compressor 130, the three-way valve 160, or the two-way valve 164, and the blower 120 based upon the loading of the CRAC unit 108. In this instance, the controller 204 may be configured to calculate the caloric heat transfer from the heated cooling fluid to the refrigerant of the CRAC units 108, 110, 110'. The caloric heat transfer (Q) may be calculated from the following equation:

$$Q=mC_p(T_{out}-T_{in}), \quad \text{Equation (1)}$$

where m is the mass flow rate of the cooling fluid, $C_p$ is the heat capacity of the cooling fluid, $T_{out}$ is the temperature of the cooled cooling fluid supplied and $T_{in}$ is the temperature of the heated cooling fluid received by the CRAC units 108, 110, 110'.

According to this example, a setpoint caloric heat transfer (Qset) range may be used in place of the setpoint temperature (Tset) range. Thus, for instance, the controller 204 may be configured to substantially minimize the power consumptions of the CRAC units 108, 110, 110' by varying operations of the compressor 130, the three-way valve 160, or the two-way valve 164, and the blower 120 so long as the caloric heat transfer (Q) is within the setpoint caloric heat transfer (Qset) range. In one respect, the caloric heat transfer (Qset) range may comprise heat transfer rates that ensure safe operating conditions for the components housed in the data center 100. The safe operating conditions for the components may be based upon the specifications provided by the component manufacturers. Alternatively, the safe operating conditions may be determined through testing of the components or through historical data. For instance, the components may be operated at various temperatures to determine at which temperatures the performance characteristics of the components being to decline or when the components begin to fail.

In similar fashion to those manners described hereinabove, if the calculated caloric heat transfer (Q) is above a maximum setpoint caloric heat transfer level (Qset,max), the components in the data center 100 may be insufficiently cooled. In addition, if the calculated caloric heat transfer (Q) is below a minimum setpoint caloric heat transfer level (Qset,min), operations of the CRAC units 108, 110, 110' may be ceased as the CRAC unit 108 may be drawing power unnecessarily.

In operation, the controllers 204 of the CRAC control systems 202, 252, 252' may determine the compressor 130, three-way valve 160, or the two-way valve 164, and the blower 120 operations to substantially minimize CRAC unit 108, 110, 110' power consumptions when the temperatures of the heated cooling fluid returned to the CRAC units 108, 110, 110' are within the setpoint temperature (Tset) range. In addition, operations of these systems may be varied when the caloric heat transfer is within the setpoint caloric heat transfer (Qset) range. More particularly, the controllers 204 may determine which combinations of compressor 130, three-way valve 160, or two-way valve 164, and blower 120 operations substantially minimize CRAC unit 108, 110, 110' power consumption levels when the temperatures of the cooling fluid received from the components are within an acceptable range.

Figure 3:
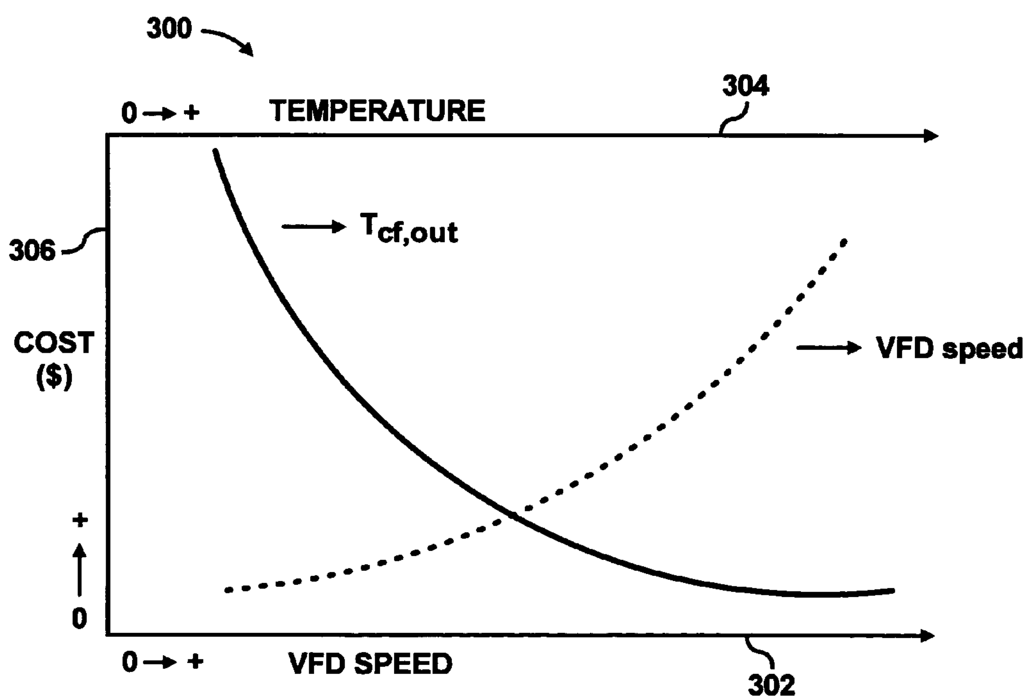
FIG. 3 illustrates a graph of various cooling system operating levels and the costs associated with their operations, according to an embodiment.

Thus, for instance, if the temperatures of the cooling fluid supplied from the components are acceptable, the controllers 204 may select operating levels of the compressor 130, the three-way valve 160, or the two-way valve 164, and the blower 120 that substantially minimize the costs associated with their operations. These operating levels and costs may be considered in terms of the graph 300 illustrated in FIG. 3. In the graph 300, there is illustrated two x-axes 302 and 304 and a y-axis 306. The first x-axis 302 denotes the speed of the blower 120 and the second x-axis 304 denotes the temperature of the cooling fluid (Tcf,out) supplied by the respective CRAC units 108, 110, 110'. The y-axis 306 denotes the energy consumptions and thus the costs associated with various cooling fluid temperatures (i.e., compressor 130, three-way valve 160, or two-way valve 164, operations) and blower 120 speeds.

The power consumption levels or costs associated with operating the compressor 130, the three-way valve 160, or the two-way valve 164, and the blower 120 at various levels may be based upon manufacturer provided specifications. In addition, or alternatively, the power consumption levels or costs may be determined through testing. In terms of testing, for instance, the power meter 206 may be used to measure the power draws of the compressor 130, the refrigeration circuit 150 (under various three-way valve 160 and the two-way valve 164 settings), and the blower 120 at different levels of operation. The correlations between the power consumption levels or costs and the operating levels of the compressor 130, the refrigeration circuit 150, and the blower 120 may be stored in the memory 208. This information may be stored in the form of, for instance, a look-up table, or through other searchable means.

As shown in the graph 300, the energy consumption level of the compressor 130 (or a refrigeration circuit 150 in the case of the CRAC units 110, 110', decreases as the temperature of the cooling fluid (Tcf,out) supplied by the CRAC unit 108 decreases at constant CRAC unit loading. In addition, the energy consumption level of the blower 120 increases as the speed of the blower 120 increases. Thus, the controllers 204 of the CRAC units 108, 110, 110' may be configured to vary the operations of the compressor 130, the three-way valve 160, or the two-way valve 164, and the blower 120 such that they consume the least amount of power while maintaining the temperatures of the cooling fluid returned into the CRAC units 108, 110, 110' within the setpoint temperature ranges.

Figure 4A:
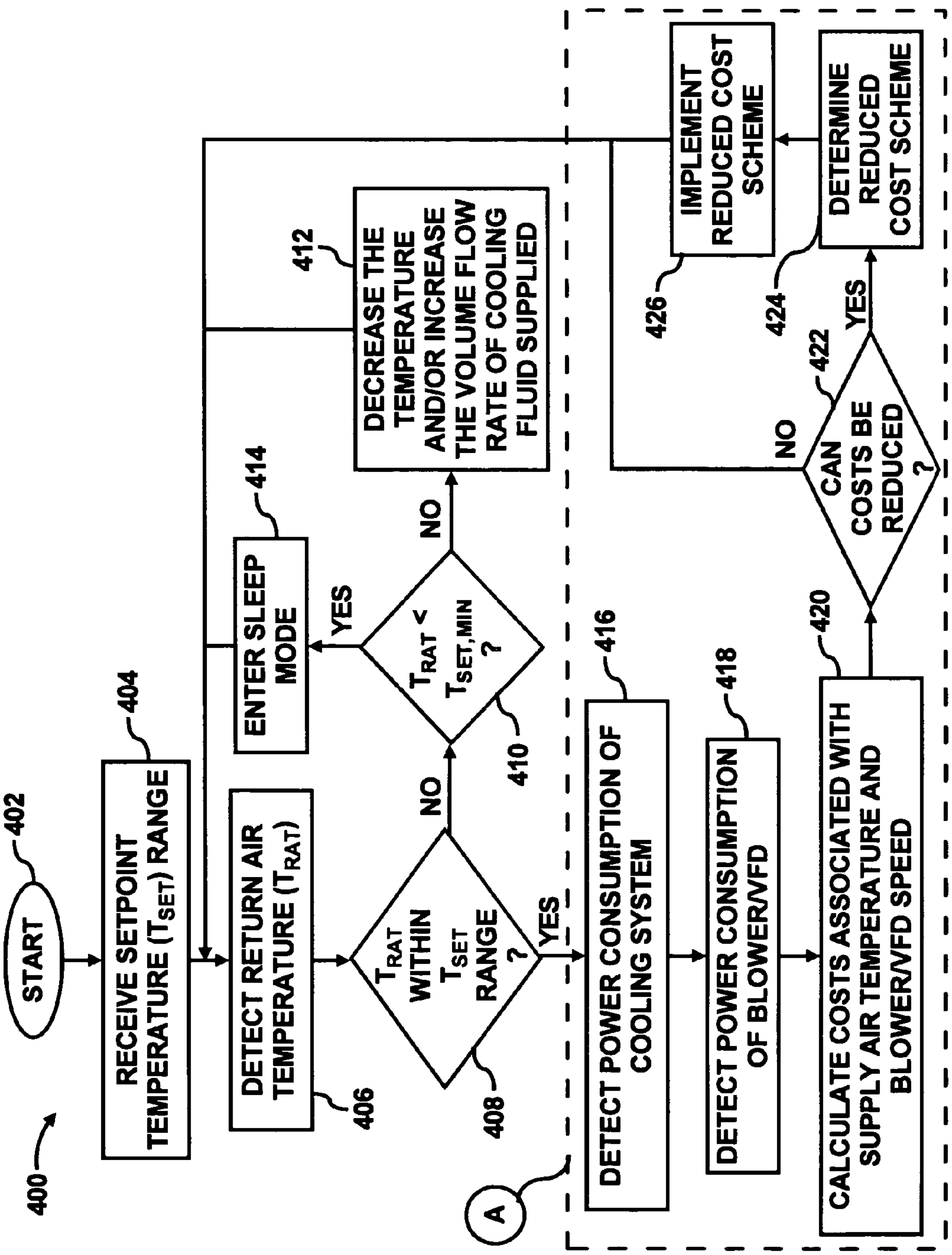
FIGS. 4A and 4B illustrate flow diagrams of operational modes of methods for CRAC unit control based upon setpoint temperatures and setpoint caloric heat transfer determinations, respectively, according to various embodiments.
Figure 4B:
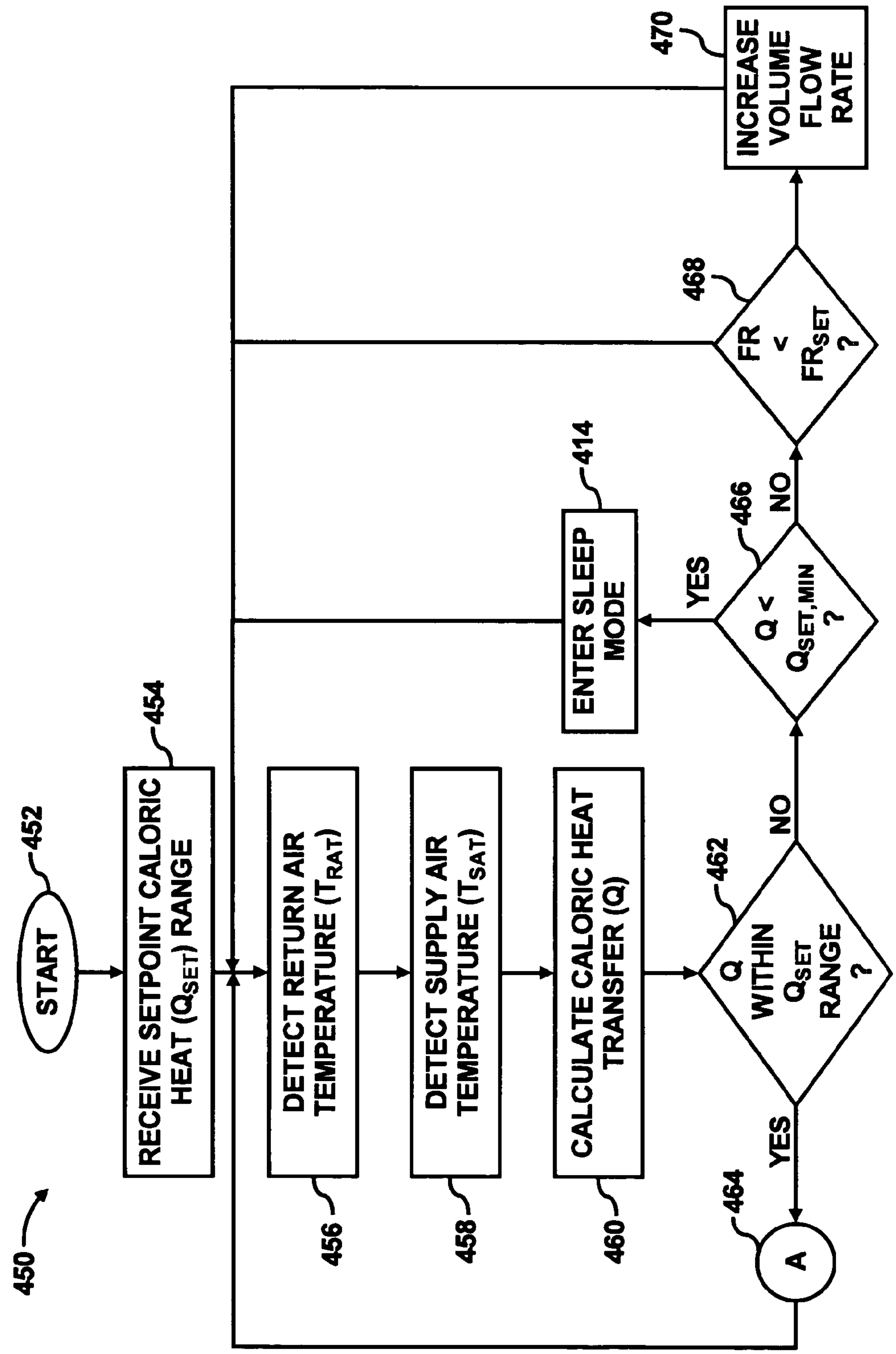

FIGS. 4A and 4B illustrate flow diagrams of operational modes 400 and 450 of methods for CRAC unit control based upon setpoint temperatures and setpoint caloric heat transfer determinations, respectively. It is to be understood that the following descriptions of the operational modes 400 and 450 are two manners of a variety of different manners in which CRAC unit control may be effectuated. It should also be apparent to those of ordinary skill in the art that the operational modes 400 and 450 represent generalized illustrations and that other steps may be added or existing steps may be removed, modified or rearranged without departing from a scope of the invention.

The descriptions of the operational modes 400 and 450 are made with reference to the block diagrams 200, 250, 250' illustrated in FIGS. 2A–2C, respectively, and thus makes reference to the elements cited therein. It should, however, be understood that the operational modes 400 and 450 are not limited to the elements set forth in the block diagrams 200, 250, 250'. Instead, it should be understood that the operational modes 400 and 450 may be practiced by CRAC unit control systems having a different configuration than those set forth in the block diagrams 200, 250, 250'.

The operational modes 400 and 450 may be initiated or started at steps 402 and 452, respectively, for instance, by activating one or more CRAC units 108, 110, 110', activating one or more components in the data center 100, etc. In addition, or alternatively, the operational mode 400 may be manually initiated, after a predetermined period of time, etc. It is to be understood that either or both of the operational modes 400 and 450 may be performed depending upon the configuration of the CRAC units 108, 110, 110'. For instance, those CRAC units 108, 110, 110' configured to operate based upon setpoint temperatures, may perform the operational mode 400, whereas those CRAC units 108, 110, 110' configured to operate based upon setpoint caloric heats may perform the operation mode 450. Additionally, performance of either operational mode 400 and 450 may be user-specified.

With reference first to the operational mode 400 of FIG. 4A, the controllers 204 of one or more of the CRAC control systems 200, 250, 250 may receive a setpoint temperature (Tset) range as indicated at step 404. The setpoint temperature (Tset) range may be supplied by the CRAC manufacturers or they may user-specified and inputted into the computing device 112 through any known input means. Step 404, however, may be omitted for situations in which the controllers 204, for instance, have previously received the setpoint temperature (Tset) range.

At step 406, one or more of the sensors 138 may detect the temperatures of the return air (Trat). A comparison of the detected return air temperatures (Trat) and the setpoint temperature (Tset) range may be made at step 408. More particularly, at step 408, it may be determined whether the temperatures of the heated cooling fluid returning into the CRAC units 108, 110, 110' are within the setpoint temperature (Tset) range. For those CRAC units 108, 110, 110' having detected return air temperatures (Trat) outside of the setpoint temperature (Tset) range, the controllers 204 of those CRAC units 108, 110, 110' may determine whether the detected return air temperatures (Trat) are below minimum setpoint temperature levels (Tset,min), at step 410. The minimum setpoint temperature levels (Tset,min) for the CRAC units 108, 110, 110' may be the same for each of the CRAC units 108, 110, 110' or they may vary for each of the CRAC units 108, 110, 110'. In this regard, for instance, each of the CRAC units 108, 110, 110' may be operated in substantially independent manners.

At step 410, for those CRAC units 108, 110, 110' having detected return air temperatures (Trat) are not below the minimum set point temperature levels (Tset,min), the detected return air temperatures (Trat) are considered as being above maximum setpoint temperature levels (Tset, max), since they are outside of the setpoint temperature (Tset) ranges. The controllers 204 of those CRAC units 108, 110, 110' may therefore decrease the temperature and/or increase the volume flow rate of cooling fluid supplied to the data center 100, as indicated at step 412. The decreased temperature and/or the increased cooling fluid volume flow rate may be required to bring the detected return air temperatures (Trat) within the maximum setpoint temperature levels (Tset,max).

Additionally, at step 412, the controllers 204 of those CRAC units 108, 110, 110' may decrease the temperature of the refrigerant/coolant and/or increase the volume flow rate of cooling fluid supplied based upon the costs associated with each action. For instance, if the costs associated with decreasing the temperature of the refrigerant/coolant is relatively less than increasing the volume flow rate, the controllers 204 may cause the refrigerant/coolant temperature to be decreased while maintaining the volume flow rate level. As another example, if the controllers 204 determine that a combination of actions are associated with the lowest costs, the controllers 204 may find substantially optimum combinations of actions to achieve the desired results at the lowest costs.

As another example, at step 412, the controllers 204 of those CRAC units 108, 110, 110' may decrease the temperature of the refrigerant/coolant and/or increase the volume flow rate of cooling fluid supplied based upon the known effectiveness of each action. Thus, for instance, the controllers 204 may have access to historical data indicating the effects of the various actions taken by the CRAC units 108, 110, 110'. By way of example, if it is determined that reducing the refrigerant/coolant temperature to a certain level requires X amount of energy and increasing the volume flow rate to another certain level requires the same amount of energy, and increasing the volume flow rate is more effective, the controllers 204 may decide to increase the volume flow rate as this action is more efficient.

At step 410, for those CRAC units 108, 110, 110' having detected return air temperatures (Trat) that are below the minimum set point temperature level (Tset,min), those CRAC units 108, 110, 110' may enter a sleep mode as indicated at step 414. The sleep mode may include a powered down mode in which the CRAC units 108, 110, 110' draw reduced amounts of power as compared to when the CRAC units 108, 110, 110' are fully operational. The reduced amounts of power may comprise power states that are somewhere between the fully operational mode and a completely shut down mode. In addition, the sleep mode may constitute a power saving mode in which the CRAC units 108, 110, 110' may be reactivated or otherwise brought back to fully operational status in a relatively short period of time. The reduced power state of the CRAC units 108, 110, 110' may vary for differing types of CRAC units.

In any regard, the sleep mode may include a mode in which the power supply to the temperature sensor 138 positioned to detect the temperature of the cooling fluid around the inlet of the CRAC unit 108, 110, 110', remains active. In addition, the sleep mode may also include the supply of a small amount of power to enable the blower to substantially continuously cause a relatively small amount of cooling fluid flow through the CRAC units 108, 110, 110'. In this regard, the temperatures of the cooling fluid supplied into the CRAC units 108, 110, 110' may be substantially continuously monitored when the CRAC units 108, 110, 110' are in the sleep mode.

The CRAC units 108, 110, 110' may exit from the sleep mode, for instance, when the detected return air temperature (Trat) exceeds the maximum setpoint temperature (Tset, max), as indicated at step 412. Alternatively, the CRAC units 108, 110, 110' may be configured to exit from the sleep mode when the return air temperature (Trat) exceeds another predefined temperature, which may be defined according to, for instance, operating requirements of the components to which the CRAC units 108, 110, 110' delivers cooling fluid. As another alternative, the CRAC units 108, 110, 110' may exit the sleep mode after a predetermined period of time, manually revived, in response to receipt of a setpoint temperature range, etc.

In another example, a plurality of CRAC units 108, 110, 110' may be networked or otherwise configured to communicate with one another. For instance, the same controller 204 may control the plurality of CRAC units 108, 110, 110'. In any regard, the controllers 204 of the CRAC units 108, 110, 110' may be configured to communicate their statuses to the other CRAC units 108, 110, 110'. The statuses of the CRAC units 108, 110, 110' may be used by the controllers 204 to determine the provisioning levels of the CRAC units 108, 110, 110'. By way of example, if one of the CRAC units 108, 110, 110' is in the sleep mode and the provisioning level of a neighboring CRAC unit 108, 110, 110' is too high, for instance, the return air temperature (Trat) into the neighboring CRAC unit 108, 110, 110' is above a predefined level, the CRAC unit 108, 110, 110' may be brought out of the sleep mode. In this instance, the return air temperature (Trat) may not need to be measured during the sleep mode thereby enabling that CRAC unit 108, 110, 110' to draw less power when in the sleep mode.

With reference back to step 408, for those CRAC units 108, 110, 110' having return air temperatures (Trat) within the setpoint temperature (Tset) range, the controllers 204 of those CRAC units 108, 110, 110' may determine the power consumption of the respective cooling systems at step 416. The cooling systems may comprise, for instance, the compressor 130 in FIG. 1B or the refrigeration circuits 150 in FIGS. 1C and 1D. The controllers 204 may also determine the power consumptions of the blowers 120 at step 418.

The power meter 206 may be employed to determine the power consumptions of the cooling system components. Alternatively, the power consumption may be calculated based upon operations of the various components, for instance, the compressor 130, the blower 120, etc. As an example, the controllers 204 may be configured to determine the power consumption of the compressor 130 based upon its current operating load. A correlation between the power consumption levels and the operating loads of the compressor 130 may be employed to make this determination.

At step 420, the power consumptions of the cooling systems and the blower 120 may be correlated to a cost function. For instance, the costs associated with the power consumed by the cooling systems and the blower 120 may be determined. In addition, the power consumed by the cooling systems and the blower 120 may be utilized in determining the operations of the cooling systems and the blower 120. The power consumptions of the cooling systems may include a determination of the conditions external to the condenser 132 or refrigeration circuit 150. That is, for instance, the costs incurred by the cooling systems may vary according to the external conditions. For instance, if ambient conditions are relatively hot and/or humid, greater amounts of energy may be expended by the cooling systems to enable sufficient heat transfer between the refrigerant and/or coolant to thereby maintain the refrigerant and/or coolant at desired temperatures.

At step 422, the controllers 204 may determine whether the costs may be reduced. The controllers 204 may ascertain whether costs may be reduced through, for instance, a determination of the output requirements of the CRAC units 108, 110, 110' to substantially maintain the cooling fluid temperature and delivery to the components in the data center within the setpoint temperature ranges.

If the costs cannot be reduced, that is, the controllers 204 determine that the CRAC units 108, 110, 110' are operating at or near optimum energy levels, the controllers 204 may not vary the cooling system operations and the operational mode 400 may be continued, for instance, at step 406. However, if the controllers 204 determine that costs may be reduced, the controllers 204 may determine a scheme to enable the costs associated with operating the cooling systems to be reduced at step 424. The controllers 204 may determine how costs may be reduced based upon the costs associated with increasing refrigerant/coolant temperature and/or decreasing the volume flow rate of the cooling fluid supplied. For instance, if the cost savings associated with increasing the temperature of the refrigerant/coolant is relatively higher than the cost savings associated with decreasing the volume flow rate, the controllers 204 may cause the refrigerant/coolant temperature to be increased while maintaining the volume flow rate level. In the alternative, if the cost savings associated with decreasing the volume flow rate is relatively higher than the cost savings associated with increasing the refrigerant/coolant temperature, the controllers 204 may cause the volume flow rate to be decreased while maintaining the refrigerant/coolant temperature level. As another example, if the controllers 204 determine that a combination of actions produces the greatest cost savings, the controllers 204 may find substantially optimum combinations of actions to achieve the desired results at the greatest cost savings.

At step 426, the controllers 204 may implement the reduced cost scheme determined at step 424. The reduced cost scheme may be implemented according to an iterative process or it may implemented according to historical data. If an iterative process is implemented, the controllers 204 may cause either or both of the cooling fluid temperature to the increased and the volume flow rate to the decreased incrementally until the CRAC units 108, 110, 110' are operating at or near optimal levels. If historical data is relied upon, the controllers 204 may know how to manipulate the CRAC units 108, 110, 110' based upon previously performed manipulations to reach the substantially optimal performance levels.

In addition, the operational mode 400 may be continued to thereby enable substantially continuous monitoring and control over the CRAC units 108, 110, 110'. In one respect, operations of the CRAC units 108, 110, 110' may be substantially continuously altered to enable energy and cost savings.

With reference now to the operational mode 450 of FIG. 4B, the controllers 204 of one or more of the CRAC control systems 200, 250, 250' may receive a setpoint caloric heat transfer (Qset) range at step 454. The caloric heat transfer (Q) of a CRAC unit 108, 110, 110' may be used to determine the workload on the CRAC unit 108, 110, 110' and may be determined through Equation (1) recited hereinabove. In this regard, and as described in greater detail hereinbelow, if the caloric heat transfer (Q) of a CRAC unit 108, 110, 110' is within a predefined range, operations of the compressor 130, the three-way valve 160, or the two-way valve 164 may be varied to substantially minimize their energy consumptions. It should be appreciated that step 454 may be omitted for situations in which the controllers 204, for instance, have previously received the setpoint caloric heat transfer (Qset) range.

At step 456, one or more of the sensors 138 may detect the temperatures of the return air (Trat) and one or more of the sensors 140 may detect the temperatures of the supply air (Tsat) at step 458. At step 460, the controllers 204 may calculate the caloric heat transfer rates (Q). In addition, the controllers 204 may determine whether the calculated caloric heat transfer rates (Q) are within the setpoint caloric heat transfer (Qset) range at step 462.

For those CRAC units 108, 110, 110' having calculated caloric heat transfer rates (Q) that are within the Qset range, steps 416–426 set forth in the box A of FIG. 4A may be performed at step 464. However, for those CRAC units 108, 110, 110' having calculated caloric heat transfer rates (Q) that are outside of the Qset range, the controllers 204 of those CRAC units 108, 110, 110' may determine whether the calculated caloric heat transfer rates (Q) are below minimum setpoint caloric heat transfer levels (Qset,min) at step 466. The Qset,min for the CRAC units 108, 110, 110' may be the same for each of the CRAC units 108, 110, 110' or they may vary for each of the CRAC units 108, 110, 110'. In this regard, for instance, each of the CRAC units 108, 110, 110' may be operated in substantially independent manners.

At step 466, for those CRAC units 108, 110, 110' having calculated caloric heat transfer rates (Q) are not below the minimum set point caloric heat transfer levels (Qset,min), the calculated caloric heat transfer rates (Q) are considered as being above maximum setpoint caloric heat transfer levels (Qset,max), since they are outside of the setpoint caloric heat transfer (Qset) ranges. The controllers 204 of those CRAC units 108, 110, 110' may determine whether the flow rates (FR) of the cooling fluid supplied by those CRAC units 108, 110, 110' are below a flow rate set point (FRset). The flow rate (FR) of the cooling fluid supplied by the CRAC units 108, 110, 110' may be detected through use of, for instance, an anemometer. In addition, or alternatively, the flow rate (FR) may be determined based upon the speed of the VFD. In any regard, the flow rate set point (FRset) may be based upon, for instance, historical data that indicates, for instance, a flow rate of cooling fluid supplied by the CRAC units 108, 110, 110' are optimal for a given CRAC unit 108, 110, 110'. The optimum flow rates may be based, for instance, on the configuration and airflow patterns of the areas in which the CRAC units 108, 110, 110' are configured to deliver the cooling fluid. In this regard, the flow rate setpoints may vary for each of the CRAC units 108, 110, 110' and may also vary as airflow patterns change.

If it is determined at step 468 that the flow rate (FR) exceeds the flow rate setpoint (FRset), the flow rate may not be varied. If, however, it is determined that the flow rate (FR) does not exceed the flow rate setpoint (FRset), the volume flow rate of the CRAC unit 108, 110, 110' may be increased as indicated at step 470. The level of increase in the volume flow rate may be based upon various factors. For instance, the level of increase may be based upon a set percentage of increase and may be based upon an iterative process where the level of increase is performed during each cycle until the flow rate (FR) equals or exceeds the flow rate setpoint (FRset). As another example, the level of increase may be based upon historical data that indicates the level of temperature change in the areas affected by the CRAC units 108, 110, 110' in response to various VFD speeds.

Also, at step 466, for those CRAC units 108, 110, 110' having caloric heat transfer rates (Q) that are below the minimum set point caloric heat transfer level (Qset,min), those CRAC units 108, 110, 110' may enter a sleep mode as indicated at step 414. The sleep mode may include a powered down mode in which the CRAC units 108, 110, 110' draw reduced amounts of power as compared to when the CRAC units 108, 110, 110' are fully operational. The reduced amount of power may comprise a power state that is somewhere between the fully operational mode and a completely shut down mode. In addition, the sleep mode may constitute a power saving mode in which the CRAC units 108, 110, 110' may be reactivated or otherwise brought back to fully operational status in a relatively short period of time. The reduced power state of the CRAC unit 108, 110, 110' may vary for differing types of CRAC units.

In any regard, the sleep mode may include a mode in which the power supply to the temperature sensor 138 positioned to detect the temperature of the cooling fluid around the inlet of the CRAC unit 108, 110, 110', remains active. In addition, the sleep mode may also include the supply of a small amount of power to enable the blower to substantially continuously cause a relatively small amount of cooling fluid flow through the CRAC unit 108, 110, 110'. In this regard, the temperature of the cooling fluid supplied into the CRAC unit 108, 110, 110' may be substantially continuously monitored when the CRAC unit 108, 110, 110' is in the sleep mode.

The CRAC units 108, 110, 110' may exit from the sleep mode, for instance, when the calculated caloric heat transfer rates (Q) exceed the maximum setpoint caloric heat transfer level (Qset,max), as indicated at step 412. Alternatively, the CRAC units 108, 110, 110' may be configured to exit from the sleep mode when the return air temperature (Trat) exceeds another predefined temperature, which may be defined according to, for instance, operating requirements of the components to which the CRAC units 108, 110, 110' delivers cooling fluid. As another alternative, the CRAC units 108, 110, 110' may exit the sleep mode after a predetermined period of time, manually revived, in response to receipt of a setpoint temperature range, etc.

In another example, a plurality of CRAC units 108, 110, 110' may be networked or otherwise configured to communicate with one another. For instance, the same controller 204 may control the plurality of CRAC units 108, 110, 110'. In any regard, the controllers 204 of the CRAC units 108, 110, 110' may be configured to communicate their statuses to the other CRAC units 108, 110, 110'. The statuses of the CRAC units 108, 110, 110' may be used by the controllers 204 to determine the provisioning levels of the CRAC units 108, 110, 110'. By way of example, if one of the CRAC units 108, 110, 110' is in the sleep mode and the provisioning level of a neighboring CRAC unit 108, 110, 110' is too high, for instance, the return air temperature (Trat) into the neighboring CRAC unit 108, 110, 110' is above a predefined level, the CRAC unit 108, 110, 110' may be brought out of the sleep mode. In this instance, the return air temperature (Trat) may not need to be measured during the sleep mode thereby enabling that CRAC unit 108, 110, 110' to draw less power when in the sleep mode.

Through operation of the operational modes 400 and 450, the energy consumption levels of the CRAC units 108, 110, 110' and therefore the costs associated with their operations may substantially be minimized. In one regard, the CRAC units 108, 110, 110' may be operated substantially independently from one another in manners to generally enable their energy efficient operations.

The operations set forth in the operational modes 400 and 450 may be contained as utilities, programs, or subprograms, in any desired computer accessible medium. In addition, the operational modes 400 and 450 may be embodied by computer programs, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 5:
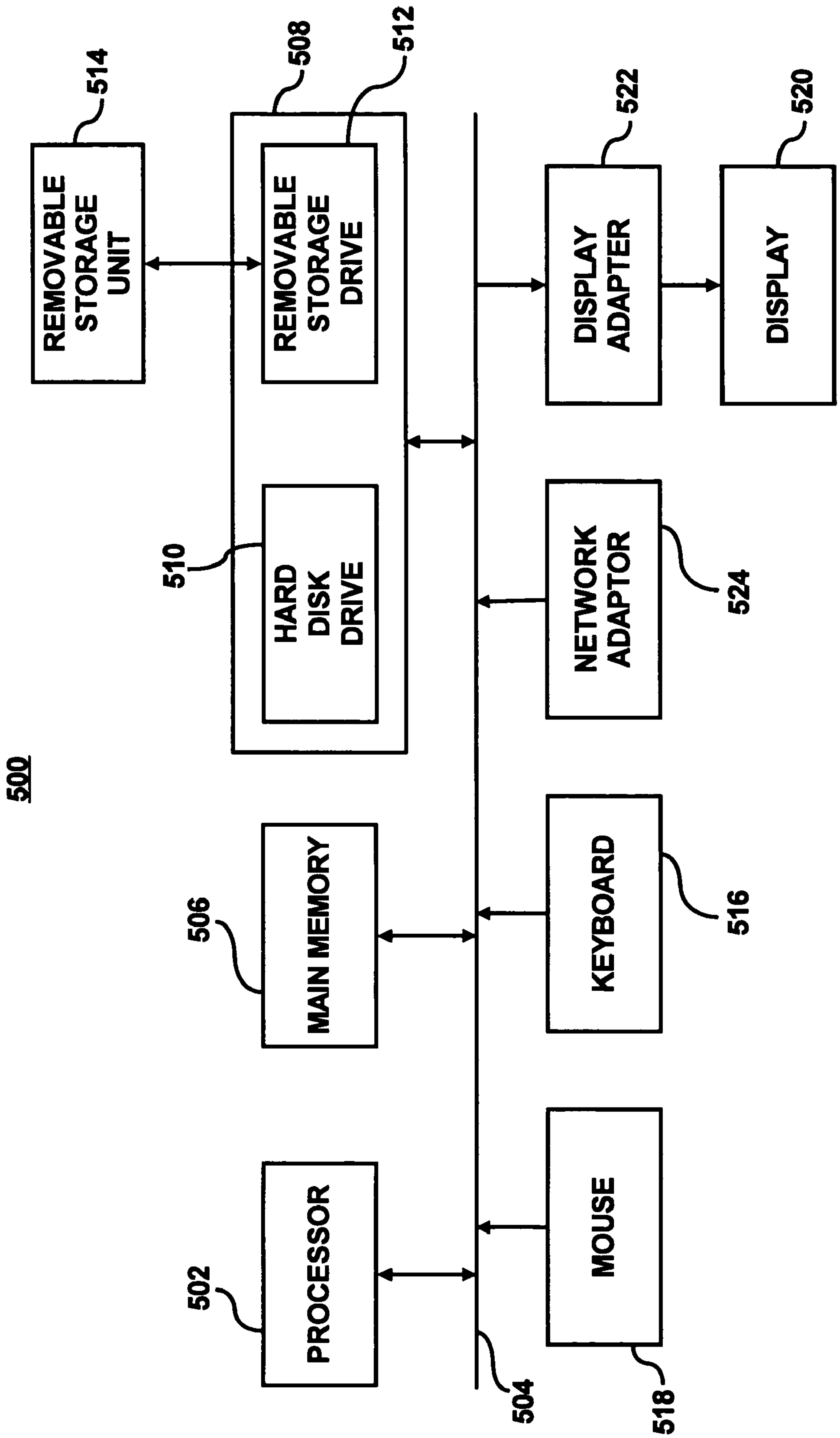
FIG. 5 illustrates a computer system which may be used as a platform for various operations described in the present disclosure, according to an embodiment.

FIG. 5 illustrates an exemplary computer system 500, according to an embodiment of the invention. The computer system 500 may include, for example, the controllers 204 and/or the computing device 112. In this respect, the computer system 500 may be used as a platform for executing one or more of the functions described hereinabove with respect to the various components of the CRAC control systems 202, 252, 252'.

The computer system 500 includes one or more controllers, such as a processor 502. The processor 502 may be used to execute some or all of the steps described in the operational modes 400 and 450. Commands and data from the processor 502 are communicated over a communication bus 504. The computer system 500 also includes a main memory 506, such as a random access memory (RAM), where the program code for, for instance, the controllers 204 and/or the controller of the computing device 112, may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the provisioning system may be stored.

The removable storage drive 510 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor 502 may communicate over a network, e.g., the Internet, LAN, etc., through a network adaptor 524.

It will be apparent to one of ordinary skill in the art that other known electronic components may be added or substituted in the computer system 500. In addition, the computer system 500 may include a system board or blade used in a rack in a data center, a conventional "white box" server or computing device, etc. Also, one or more of the components in FIG. 5 may be optional (e.g., user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for controlling one or more computer room air conditioning (CRAC) units for energy efficient operation, wherein said CRAC units comprise a cooling system and a blower, said one or more CRAC units being configured to receive return air, and wherein said cooling system comprises at least one of a refrigerant and a coolant configured to cool the return air, said method comprising:

detecting a power consumption of the cooling system;

detecting a power consumption of the blower;

calculating costs associated with the cooling system power consumption and the blower power consumption;

comparing the costs associated with increasing the temperature of the at least one of the refrigerant and the coolant and the costs associated with decreasing the volume flow rate of air delivered by the blower; and reducing at least one operation of the one or more CRAC units in response to the compared costs.

2. The method according to claim 1, wherein the step of reducing at least one operation of the one or more CRAC units comprises increasing the temperature of the at least one of the refrigerant and the coolant in response to the costs associated with increasing the temperature of the at least one of the refrigerant and the coolant being below the costs associated with decreasing the volume flow rate of air delivered by the blower; and wherein the step of reducing at least one operation of the one or more CRAC units comprises decreasing the volume flow rate of air delivered by the blower in response to the costs associated with decreasing the volume flow rate of air delivered by the blower being below the costs associated with increasing the temperature of the at least one of the refrigerant and the coolant.

3. The method according to claim 1, wherein the cooling system includes at least one of a refrigerant and a coolant configured to cool the return air, and wherein the step of calculating costs comprises calculating costs associated with increasing the temperature of at least one of the refrigerant and the coolant and decreasing a volume flow rate of air delivered by the blower, the method further comprising:

determining a level of increased temperature of the at least one of the refrigerant and the coolant and a level of decreased volume flow rate of air delivered by the blower that relates to minimized costs associated with increasing the temperature of the at least one of the refrigerant and the coolant and with decreasing the volume flow rate of air delivered by the blower; and wherein the step of reducing at least one operation of the one or more CRAC units comprises implementing the determined level of increased temperature of the at least one of the refrigerant and the coolant and the determined level of the decreased volume flow rate of the air delivered by the blower.

4. The method according to claim 1, wherein the cooling system comprises at least one of a variable capacity compressor and a constant capacity compressor with a variable frequency drive (VFD), and wherein the step of reducing at least one operation of the one or more CRAC units comprises reducing the speed of the at least one of the variable capacity compressor and the constant capacity compressor with the VFD.

5. The method according to claim 1, wherein the cooling system comprises a three-way valve located upstream of a cooling coil, said cooling system further comprising a refrigeration circuit configured to cool a coolant for delivery into the cooling coil, said three-way valve being configured to control the temperature of the coolant contained in the cooling coil by controlling coolant delivery into the cooling coil, wherein the step of reducing a least one operation of the one or more CRAC units comprises reducing the coolant delivery into the cooling coil to thereby reduce the energy consumption of the refrigeration circuit in cooling the coolant.

6. The method according to claim 1, wherein the cooling system comprises a two-way valve located upstream of a cooling coil, said cooling system further comprising a refrigeration circuit configured to cool a coolant for delivery into the cooling coil, said two-way valve being configured to control the temperature of the coolant contained in the cooling coil by controlling coolant delivery into the cooling coil, wherein the step of reducing at least one operation of the one or more CRAC units comprises reducing the coolant delivery into the cooling coil to thereby reduce the energy consumption of the refrigeration circuit in cooling the coolant.

7. The method according to claim 1, wherein the blower comprises a variable frequency drive (VFD), and wherein the step of reducing at least one operation of the one or more CRAC units comprises operating the VFD to reduce the speed of the blower to thereby reduce to power consumption of the blower.

8. A method for controlling one or more computer room air conditioning (CRAC) units for energy efficient operation, wherein said CRAC units comprise a cooling system and a blower, said one or more CRAC units being configured to receive return air, and wherein said cooling system comprises at least one of a refrigerant and a coolant configured to cool the return air, said method comprising:

detecting the temperature of the air returned (Trat) into the one or more CRAC units;

determining whether the Trat is below a minimum setpoint temperature level-in calculating costs associated with decreasing the temperature of at least one of the refrigerant and the coolant;

calculating costs associated with increasing a volume flow rate of air delivered by the blower;

comparing the costs associated with decreasing the temperature of at least one of the refrigerant and the coolant and the costs associated with increasing the volume flow rate of air delivered by the blower; and operating the one or more CRAC units to at least one of decrease a temperature of at least one of a refrigerant and a coolant and increase a volume flow rate of cooling fluid delivered by a blower of the one or more CRAC units in response to the Trat being above the minimum setpoint temperature level.

9. The method according to claim 8 wherein the step of operating the one or more CRAC units comprises decreasing the temperature of the at least one of the refrigerant and the coolant in response to the costs associated with decreasing the temperature of the at least one of the refrigerant and the coolant being below the costs associated with increasing the volume flow rate affair delivered by the blower;

end wherein the step of operating the one or more CRAC units comprises increasing the volume flow rate of air delivered by the blower in response to the casts associated with increasing the volume flow rate of air delivered by the blower being below the costs associated with decreasing the temperature of the at least one of the refrigerant and the coolant.

10. The method according to claim 8 wherein the step of calculating costs comprises calculating costs associated with decreasing the temperature of at least one of the refrigerant and the coolant and increasing a volume flow rate of air delivered by the blower, the method further comprising:

determining a level of decreased temperature of the at least one of the refrigerant and the coolant and a level of increased volume flow rate of air delivered by the blower that relates to minimized costs associated with decreasing the temperature of the at least one of the refrigerant and the coolant and with increasing the volume flow rate of air delivered by the blower; and wherein the step of operating the one or more CRAC units comprises implementing the determined level of decreased temperature of the at least one of the refrigerant and the coolant and the determined level of the increased volume flow rate of the air delivered by the blower.

11. The method according to claim 8 further comprising causing the one or more CRAC units to enter into a reduced power mode in response to the Trat being below the minimum setpoint temperature level.

12. The method according to claim 11 further comprising:

detecting the Trat while the one or more CRAC units are in the reduced power mode; and causing the one or more CRAC units to exit from the reduced power mode in response to the Trat exceeding a predefined temperature level.

13. The method according to claim 11 wherein the one or more CRAC units comprise a plurality of CRAC units, and wherein the plurality of CRAC units are configured to communicate with each other, the method further comprising:

signaling a CRAC unit to exit from the reduced power mode in response to a Trat of another CRAC unit exceeding a predefined level.

14. The method according to claim 1, wherein the one or more CRAC units comprise a plurality of CRAC units, and wherein one or more of the plurality of CRAC units are configured with at least one of a three-way valve and a two-way valve to control coolant delivery into a cooling coil of the one or more of the CRAC units, the method further comprising:

operating the plurality of CRAC units to enable the one or wore of the plurality of CRAC units to maintain the at least one of the three-way valve and the two-way valve substantially at 100% open positions to thereby reduce energy usage by the one or more of the plurality of CRAC units.

15. A computer room air conditioning (CRAC) unit comprising:

a return air temperature sensor; and a controller configured to compare the temperature of the return air (Trat) with a predetermined setpoint temperature range to determine whether the Trat is below a minimum setpoint temperature level in response to the Trat being outside of the predetermined setpoint temperature range, wherein the controller is further configured to reduce at least one operation of the CRAC unit by at least one of decreasing a temperature of cooling fluid delivered by the CRAC unit and increasing a volume flow rate of c un fluid delivered by the CRAC unit in response to the Trat being above the minimum setpoint temperature level and wherein the controller is configured to cause the CRAC unit to enter into a reduced power mode in response to the Trat being below the minimum setpoint temperature level and cause the CRAC unit to withdraw the CRAC unit from the reduced power mode in response to the detected Trat exceeding a predefined temperature level.

16. The CRAC unit of claim 15, further comprising:

a cooling system;

a blower; and a power meter configured to detect a power consumption of the cooling system and the blower, wherein the controller is configured to calculate costs associated with the power consumptions of the cooling system and the blower and to base the reduction of the at least one operation of the CRAC unit on the costs associated with operating the cooling system and the blower.

17. The CRAC unit according to claim 16 wherein the cooling system comprises at least one of a variable capacity compressor and a constant capacity compressor with a variable frequency drive (VFD), and wherein the controller is operable to reduce operations of the at least one of the variable capacity compressor and the constant capacity compressor with a VFD in response to the temperature of the return air being within the predetermined setpoint temperature range.

18. The CRAC unit according to claim 16 wherein the cooling system comprises a three-way valve located upstream of a cooling coil, said cooling system further comprising a refrigeration circuit configured to cool a coolant for delivery into the cooling coil, said three-way valve being configured to control the temperature of the coolant contained in the cooling coil by controlling coolant delivery into the cooling coil, wherein the controller is configured to operate the three-way valve to reduce the coolant delivery into the cooling coil in response to the return air being within the predetermined setpoint temperature range.

19. The CRAC unit according to claim 16 wherein the cooling system comprises a two-way valve located upstream of a cooling coil, said cooling system further comprising a refrigeration circuit configured to cool a coolant for delivery into the cooling coil, said two-way valve being configured to control the temperature of the coolant contained in the cooling coil by controlling coolant delivery into the cooling coil, wherein the controller is configured to operate the two-way valve to reduce the coolant delivery into the cooling coil in response to the return air being within the predetermined setpoint temperature range.

20. The CRAC unit according to claim 16 wherein the blower comprises a variable frequency drive (VFD), and wherein the controller is configured to operate the VFD to reduce the speed of the blower in response to the return air being within the predetermined setpoint temperature range.

21. A system for controlling a computer room air conditioning (CRAC) unit, said system comprising:

means for detecting a temperature of air returned (Trat) into the CRAC unit;

means for determining whether the Trat is within a predetermined setpoint temperature range, said means for determining also including means for reducing at least one operation of the CRAC unit in response to the Trat being within the predetermined setpoint temperature range; and means for causing CRAC unit to enter into a reduced power mode in response to the Trat being below the minimum setpoint temperature level, said means for detecting Trat being configured to detect the Trat while the CRAC unit is in the reduced power mode, and wherein the means for determining is further configured to cause the CRAC unit to exit from the reduced power mode in response to the Trat exceeding a predefined temperature level.

22. The system according to claim 21 further comprising:

means for varying a temperature of cooling fluid supplied by the CRAC unit;

means for varying a volume flow rate of cooling fluid supplied by the CRAC unit; and means for detecting a power consumption of the means for varying temperature and the means for varying volume flow rate, wherein the means for determining comprises means for calculating costs associated with the power consumptions of the means for varying temperature and the means for varying volume flow rate.

23. The system according to claim 22 wherein the means for determining further comprises means for comparing the Trat to a minimum setpoint temperature level, said means for determining further comprising means for operating at least one of the means for varying temperature and the means far varying volume flow rate to operate at reduced energy consumption levels in response to the Trat being below the minimum setpoint temperature level.

24. A computer readable storage medium on which is embedded one or more computer programs, said one or more computer programs implementing a method for controlling a computer room air conditioning (CRAC) unit for energy efficient operation, said CRAC unit being configured to receive return air, said one or more computer programs comprising a set of instructions for:

detecting the temperature of the air returned (Trat) into the CRAC unit;

determining whether the Trat is within a predetermined setpoint temperature range;

determining whether the Trat is below a minimum setpoint temperature level in response to the Trat being outside of the predetermined setpoint temperature range;

causing the CRAC unit to enter into a reduced power mode in response to the Trat being below the minimum setpoint temperature level;

detecting the Trat while the CRAC unit is in the reduced power mode; and causing the CRAC unit to exit from the reduced power mode in response to the Trat exceeding a predefined temperature level.

25. The computer readable storage medium according to claim 24, said one or more computer programs further comprising a set of instructions for:

operating the CRAC unit to at least one of decrease a temperature of cooling fluid delivered by the CRAC unit and increase a volume flow rate of cooling fluid delivered by the CRAC unit in response to the Trat being above the minimum setpoint temperature level.

* * * * *

UNITED STATES PATENT AND TRADEMARK OFFICE

CERTIFICATE OF CORRECTION

PATENT NO. : 7,010,392 B2
APPLICATION NO. : 10/853522
DATED : March 7, 2006
INVENTOR(S) : Cullen E. Bash et al.

It is certified that error appears in the above-identified patent and that said Letters Patent is hereby corrected as shown below:

In column 2, line 37, above “A method for controlling one or more computer room air” insert -- SUMMARY OF THE INVENTION --.

In column 6, lines 62-63, delete “acompressor 130, acondenser 132” and insert -- a compressor 130, a condenser 132 --, therefor.

In column 15, line 49, delete “250 may” and insert -- 250' may --, therefor.

Signed and Sealed this

First Day of December, 2009

David J. Kappos

David J. Kappos
*Director of the United States Patent and Trademark Office*